US006627922B1

(12) United States Patent
Ishinaga

(10) Patent No.: US 6,627,922 B1
(45) Date of Patent: Sep. 30, 2003

(54) CHIP-TYPE SEMICONDUCTOR LIGHT EMITTING DEVICE

(75) Inventor: Hiroki Ishinaga, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 0 days.

(21) Appl. No.: 09/559,428

(22) Filed: Apr. 27, 2000

(30) Foreign Application Priority Data

Apr. 30, 1999 (JP) .......................................... 11-124410

(51) Int. Cl.$^7$ ................................................ H01L 29/22
(52) U.S. Cl. ...................... 257/99; 257/100; 257/101; 257/98
(58) Field of Search ........................... 257/81, 99, 100, 257/101, 98, 678, 787

(56) References Cited

U.S. PATENT DOCUMENTS

| | | | | |
|---|---|---|---|---|
| 4,125,777 A | * | 11/1978 | O'Brien ........................ 357/19 |
| 4,445,132 A | * | 4/1984 | Ichikawa ...................... 357/32 |
| 4,550,333 A | * | 10/1985 | Ridder et al. ................ 257/712 |
| 5,335,361 A | * | 8/1994 | Ghaem ......................... 359/163 |
| 5,504,349 A | * | 4/1996 | Yoshino ....................... 257/697 |
| 5,753,929 A | * | 5/1998 | Bliss ............................. 250/551 |
| 5,814,871 A | * | 9/1998 | Furukawa et al. ........... 257/432 |
| 6,008,529 A | * | 12/1999 | Wu ............................... 257/676 |
| 6,091,084 A | * | 7/2000 | Fujii ............................. 257/82 |
| 6,180,962 B1 | * | 1/2001 | Ishinaga ....................... 257/99 |
| 6,184,543 B1 | * | 2/2001 | Kawatani ..................... 257/98 |
| 6,365,920 B1 | * | 4/2002 | Abramov et al. ........... 257/81 |

OTHER PUBLICATIONS

Leung, Analysis of Photon Capturing in Light Emitting Diode with Different Surfaces 1999, IEEE, pp. 1044–1045.*

* cited by examiner

*Primary Examiner*—Wael Fahmy
*Assistant Examiner*—Nathan W. Ha
(74) *Attorney, Agent, or Firm*—Arent Fox Kintner Plotkin & Kahn, PLLC

(57) ABSTRACT

On a rectangle-shaped insulation substrate (1) on which a pair of electrodes (2) and (3) are provided, a light emitting element chip (4) having an n-side electrode (41) and a p-side electrode (42) connected to the pair of electrodes respectively is provided. Then, the periphery of the light emitting element chip is covered with the light transmitting member (6), and a light reflection member (7) covering at least a portion of the light transmitting member is provided so that light is radiated from a portion of the light transmitting member which is not covered and exposed. A light reflection member is provided in such a manner that the portion of the light transmitting member is not covered is exposed over from a one side (A) to at least a part of the side portions (B) and (C) on both sides connected to the side portion (A). As a consequence, the directivity is widened with the result that the dark is hardly generated between the light sources which can be used as backlight even when the light sources are arranged in a large interval.

8 Claims, 4 Drawing Sheets

CHIP-TYPE SEMICONDUCTOR LIGHT EMITTING DEVICE

FIELD OF THE INVENTION

The present invention relates to a chip-type semiconductor light emitting device in which a light emitting element chip is bonded on an insulation substrate, and light is applied in a direction parallel to the surface of the insulation substrate, namely, in a direction of a side surface of the device. More particularly, the invention relates to a chip-type light emitting semiconductor light emitting device which emits from a side surface, and is capable of widening a directivity so that a portion which is referred to as a dark decreases where light is not allowed to be incident on a light transmitting plate even with the widening of a interval of the light emitting devices even in the case where light source is adopted which allows light to be incident on a light transmitting plate which serves, for example, as a backlight of a liquid crystal display device.

BACKGROUND OF THE INVENTION

A chip-type semiconductor light emitting device which is generally used is constituted in such a manner that light is emitted toward an upper surface side by bonding a light emitting element(diode) chip(hereinafter referred to as an LED chip) on an insulation substrate and covering on the periphery of the LED chip with a light transmitting resin. However, since it is required to install a light source on a side of a plate-like light transmitting plate, for example, as a light source for allowing light to be incident on the light transmitting plate of the backlight of the liquid crystal display device, a lamp-type light emitting device is conventionally used. However, these days, a so-called side surface emitting chip-type light emitting device(chip-type light emitting device which emits from the side face) is used in which the chip-type light emitting device is allowed to emit light in a direction parallel to the insulation substrate. Such side surface emitting chip-type light emitting device has a structure, for example, as shown in FIG. 4.

In FIG. 4, reference numeral 21 denotes an insulation substrate formed of, for example, a glass epoxy or the like. On the sides of both end portions of the insulation substrate 21, conductive films are provided, and a pair of electrodes 22 and 23 are formed thereon. On the surface of the insulation substrate, an LED chip 24 is bonded and is electrically connected to the pair of the electrodes 22 and 23 by wire 25 or the like (in an example shown in FIG. 4, one of the electrodes of the LED chip 24 is formed on the rear surface side thereof and is directly connected to the electrode 22 with the bonding paste). Furthermore, the periphery thereof is covered with a light transmitting resin 26. Furthermore, the external circumference of the resin 26 is covered with a case 27 formed of a light shielding material having a light reflecting characteristic. Incidentally, the chip-type semiconductor light emitting device has a structure constituted in such a manner that a through holes 21a are provided on both end portions of the insulation substrate 21, the electrodes 22 and 23 are connected to the rear surface of the substrate 21 with a conductive films provided inside of the through holes 21a, and printed substrate, mother board or the like to be electrically connected.

In the case where such light emitting device is installed on the side surface of the light transmitting plate to constitute a backlight, as shown in FIG. 5, the chip-type light emitting device has a structure constituted in such a manner that a side surface emitting chip-type light emitting device 20 is arranged on one side wall of the light transmitting plate 30 in a definite interval, light is allowed to be incident on the inside of the light transmitting plate 30 and is allowed to be scattered within the light transmitting plate 30 to allow light to be applied from the surface the light transmitting plate 30.

As described above, the conventional side surface emitting chip-type light emitting device is formed in such a manner that a light transmitting resin is allowed to be exposed only on one side surface of the insulation substrate having a rectangular shape so that light is allowed to be applied in a direction parallel to the substrate from one side surface of the insulation substrate. Then, the surfaces other than the one side surface is formed in such a manner that the light transmitting resin is completely covered with the case 27 to allow light to be applied only from the side of the one side surface with the result that the emitted light is effectively used and the efficiency of the light emitted to outside can be improved. Consequently, the chip-type light emitting device has a structure such that the exposed portion of the light transmitting resin and the bottom portion on the opposite side thereof has a concave shape in the case, and an LED chip is placed on the bottom portion side with the result that light is applied from an open portion of the case 27.

As a consequence, a bundle of light that is radiated from one side surface is such that a strong light is emitted in a central direction and the directivity thereof is narrowed down. As a consequence, as shown in FIG. 5, when light emitting devices are arranged in a definite interval on a side surface of the light transmitting plate 30, a portion which is referred to as a dark portion 31 is generated in which light is not allowed to be incident at a portion of the light transmitting plate 30 between the light emitting devices 20. A portion of such dark portion 31 is compensated with light which is reflected and brought back within the light transmitting plate 30, but the dark portion 31 has a problem such that the portion has a different luminance from a portion on which light is directly allowed to be incident so that the luminance does not become uniform on the entire surface of the light transmitting plate 30.

In order to solve such a problem, the interval between the light emitting devices must be narrowed down with an increase in the number of the light emitting devices with the result that the production cost will increase.

SUMMARY OF THE INVENTION

The present invention has been made to solve such a problem, and an object of the invention is to provide a side surface emitting chip-type semiconductor light emitting device having a wide directivity wherein a dark is hardly generated between light sources in the case where the light sources for use in backlights are arranged in a definite interval.

Another object of the present invention is to provide a side surface emitting chip-type semiconductor light emitting device which can be manufactured at simple steps wherein bending of wires is not generated at the manufacturing stage so that a good quality light emitting device can be provided.

The chip-type semiconductor device according to the present invention comprises:

a rectangle-shaped insulation substrate on which a pair of electrodes are provided;

a light emitting element chip provided on the insulation substrate, the device having an n-side electrode and a p-side electrode connected to the pair of electrodes respectively;

a light transmitting member being provided on the insulation substrate and covering the periphery of the light emitting element chip; and a light reflection member covering at least a part of the light transmitting member, the light reflection member being provided to radiate light from the portion of the light transmitting member which is not covered and exposed;

wherein the above light reflection member is formed in such a manner that the portion of the light transmitting member which is not covered with the light reflection member and is exposed is exposed over from one side in the rectangle shape to at least a part of the side portions on both sides which continue to the one side.

Here, the light transmitting member refers to a material which transmits light which is emitted with the light emitting element chip. The material is not required to be transparent. A material which transmits light while scattering light such as white milk light or the like is included in the material.

With the constitution of such a structure, light is applied not only from one side surface but from the other side surface which continues to the one side surface with the result that the directivity is extremely widened, and the dark portion is largely decreased even when the device is used in the backlight or the like. As a consequence, a backlight with a uniform luminance can be obtained with small light source.

Out of the n-side and the p-side electrodes in the light emitting element chip, at least one of the electrodes is connected to one of the pair of the electrodes with wire bonding. When the wire is bonded in such a manner that a direction in which a wire in the wire bonding is extended is approximately parallel to one side which light transmitting member is exposed on, preferably the wire is not allowed to flow or to be severed with the flow of resin in the case where this semiconductor light emitting device is manufactured. In other words, in the case where the light emitting device of this kind is manufactured, for example, about 1000 LED chips are arranged and bonded both vertically and horizontally on a large insulation substrate. Then, in order to form the light transmitting member having the above structure, it is preferable to manufacture the device from the viewpoint of a reduction in the manufacture cost, by flowing the resin from one end portion of a group of devices which are arranged horizontally, for example, as shown in FIG. 2(b). Since the direction of the above wire corresponds to the direction in which this resin flows, a resistance with the resin becomes small and the wire flow and the wire disconnection are hardly generated.

Preferably, a boundary portion between one side and side portions on both sides which continue to the side is formed in an arc-like shape in a plane shape because the continuity of light which is applied from one side surface to the side of the adjacent side surface is improved and the directivity is improved.

When the above light transmitting member is made of a material having a light scattering function, the directivity is widened in the same manner. In this case, the above boundary portion is not formed in an arc-like shape and may be formed in a square shape. In the case of the formation of the portion in the square shape, since the flow of the resin can be made smooth with a simple die structure, a void or the like is not formed in the light transmitting member and the light radiation characteristic is improved.

When a pair of rear electrodes are formed on the rear side of the above insulation substrate, the above pair of rear electrodes are electrically connected to the pair of electrodes provided on the surface of the above insulation substrate via the through hole, and at the same time, the surface side of the through hole is sealed respectively with the above pair of the electrodes provided on the surface of the insulation substrate, the through hole is sealed even in the case where the light transmitting member is formed with molding formation with the result that the molding formation can be done without the dripping of the resin.

When the above reflection member is formed in such a manner that the member is bent to a back side from an upper surface, and a section form is an L-shape, the reflection member which is formed in advance in a length corresponding to the number of the members arranged horizontally is covered, and then, the resin of the light transmitting member can be flowed from the side with the result that the light emitting device can be simply manufactured without the formation of a void such as air reservoir or the like within the light transmitting member.

When the back side wall of the above reflection member which is the side wall opposite to the one side of the exposed light transmitting member is formed in a concave shape, light is collected forward to some extent. Thus, the emitted light can be effectively used.

DETAILED DESCRIPTION OF THE INVENTION

Figure 1A:
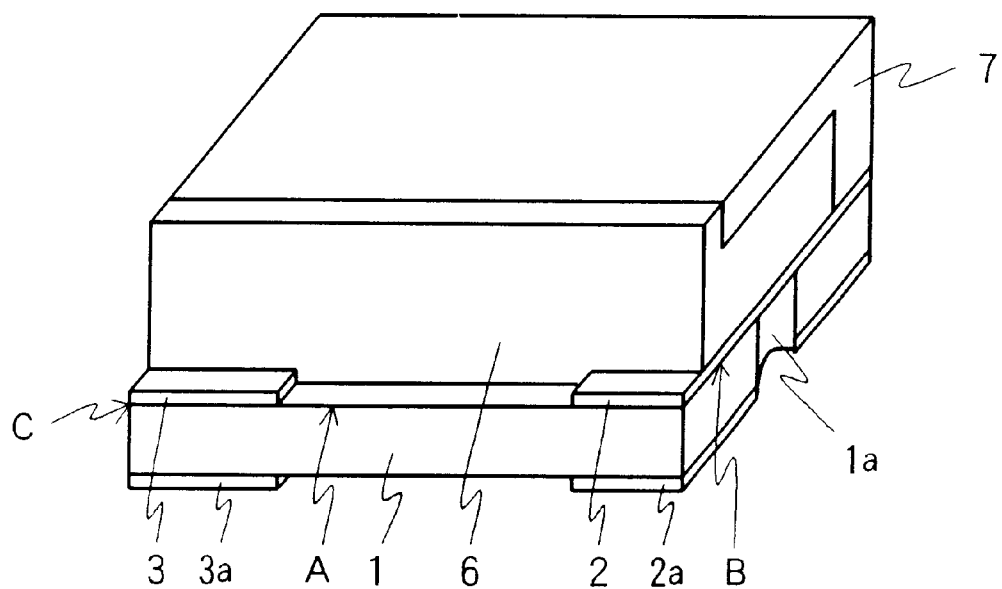
FIGS. 1(a) to 1(b) are views for explaining a perspective state and a section state of one embodiment of a side surface emitting chip-type semiconductor light emitting device according to the present invention.
Figure 1B:
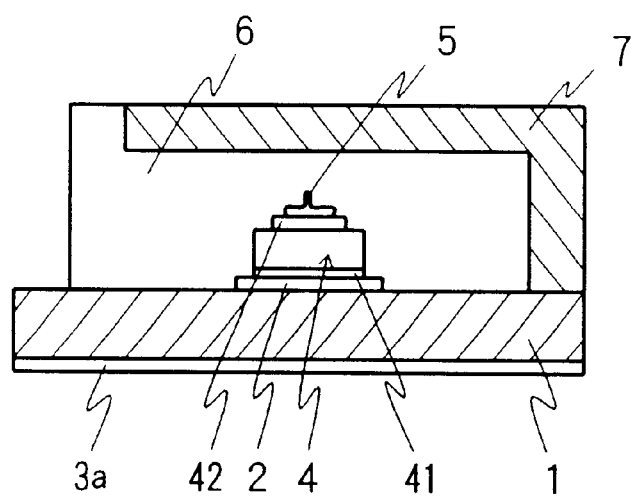
Figure 2A:
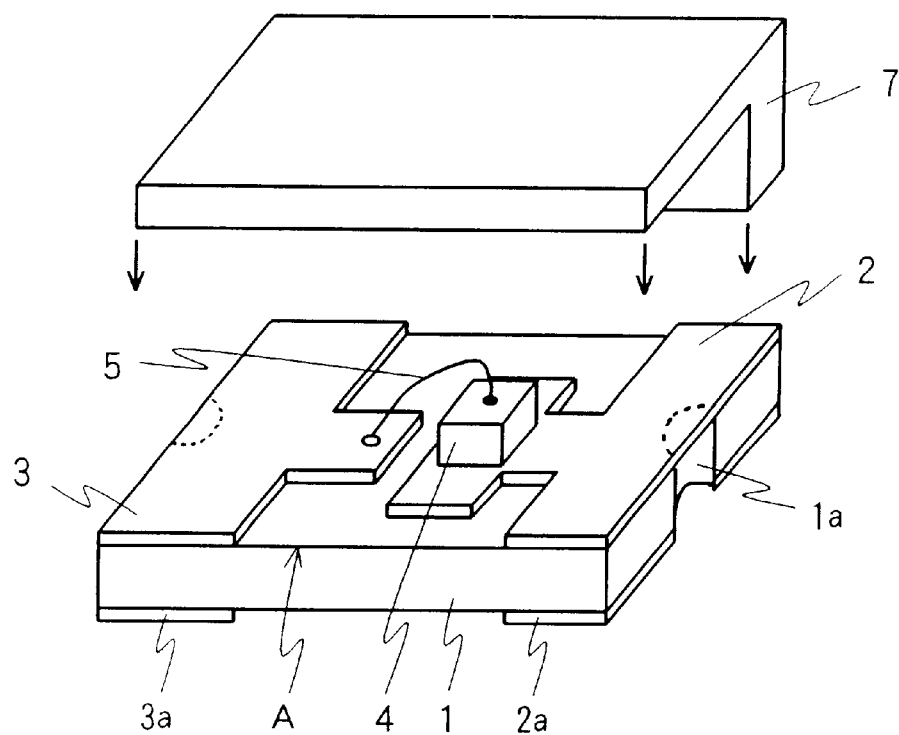
FIGS. 2(a) to 2(b) are broken perspective view of the light emitting device in FIG. 1 and an explanatory view showing a state of a large substrate at the manufacturing stage.

As described in FIGS. 1(a) through 1(b) showing a perspective view and a sectional view of one embodiment, and as described in FIG. 2(a) showing a broken perspective view thereof respectively, a chip-type semiconductor light emitting device according to the present invention is constituted in such a manner that a light emitting element chip 4 having an n-side electrode 41 and a p-side electrode 42 connected to a pair of electrodes 2 and 3 respectively is provided on a rectangle-shaped insulation substrate 1 on which the pair of electrodes 2 and 3 are provided. Then, the periphery of the light emitting element (diode) chip 4 (LED chip) is covered with the light transmitting member 6, and a light reflection member (case) 7 is provided in such a manner that light is radiated from the portion of the light transmitting member 6 which is not covered and exposed. Then, the light reflection member 7 is formed in such a manner that at least a part of the light transmitting member 6 is covered, and the portion of the light transmitting member 6 which is not covered is exposed from one side A of the above rectangle-shaped over to at least one part of the both side portions B and C on both sides which are connected to the one side.

The insulation substrate 1 is formed of an insulation substrate such as BT resin or the like which is formed by allowing a heat-resistant BT resin to be impregnated into, for example, glass cloth or the like. A pair of electrodes 2 and 3 are formed by providing the conductive film formed of, for example, copper or the like on the insulation substrate 1, a through hole 1a is further formed on the side walls of both end portions, electrodes 2 and 3 on the surface side are connected to rear electrodes 2a and 3a provided on the rear side of the insulation substrate 1 via the conductive film provided inside of the through hole 1a, and both electrodes 2 and 3 are connected to wires on the printed board not shown by soldering light emitting devices on the rear surface of the printed board.

Incidentally, as shown in FIG. 2(a), the through hole 1a is not completely penetrated. The conductive film (electrodes 2 and 3) on the surface side is retained so that the upper surface of the through hole is covered. The purpose thereof is to prevent the light transmitting resin from flowing into the through hole la from the surface side of the substrate 1 at the time of mold forming the light transmitting member 6 which will be described later, and to enable the formation of the light transmitting member 6 for the portion of a plurality of devices which are arranged horizontally on the insulation substrate 1. As a method for forming such a through hole 1a, the conductive film of the through hole portion is removed in a circular shape at the time of patterning the conductive film on the rear surface of the insulation substrate 1 having, for example, the conductive film provided both on the surface side and the rear surface side, and the processing is suspended at the portion of the conductive film on the surface side by subjecting the insulation substrate 1 having the conductive film to be removed and exposed, because the energy of the laser processing can etch the portion of the insulation material, but the energy cannot etch the conductive film, so that the through hole 1a having the covered surface is formed. Incidentally, within the through hole 1a, the conductive film is formed with non-electrolytic plating or electrolytic plating, and the surface electrodes 2 and 3 and the rear electrodes 2a and 3a are electrically connected to each other.

An LED chip 4 is constituted in such a manner that a p-n junction is formed on the substrate with AlGaAs type compound semiconductor layers or AlGaInP based compound semiconductor layers, GaP layers or GaN based compound semiconductor layers, or a double hetero junction structure is formed on the substrate with such semiconductor layers, in which the active layer is sandwiched with an n-type and a p-type clad layer which is the semiconductor layers having different composition from the active layer, or a pin structure is formed on the substrate with such semiconductor layers, with the result that an n-side and a p-side electrode 41 and 42 are provided on the rear surface side of the semiconductor substrate and the surface side of the laminated semiconductor layers. In the case where an insulation substrate such as sapphire or the like is used as the GaN based compound semiconductor LED chip, no electrode can formed on the rear surface of the substrate, a part of the laminated semiconductor layers are removed by etching, and an electrode is formed on the lower semiconductor layer exposed. In such a case, both electrodes are connected to the pair of electrodes 2 and 3 provided on both ends of the insulation substrate 1 by wire bonding. Each of the above semiconductor material is selected with the desired light emitting wavelength.

In an example shown in FIG. 1, an n-side electrode 41 is formed on the rear surface of the semiconductor substrate, and a p-side electrode 42 is formed on the upper surface of the laminated semiconductor layers, and the n-side electrode 41 is directly connected to one electrode 2 with conductive bonding agent, and the p-side electrode 42 is electrically connected to the other electrode 3 by the wire 5 such as gold line or the like. The bonding of the LED chip 4 and the bonding of the wire 5 are done in such a manner that a direction in which this wire 5 is pulled becomes approximately parallel to one side A of the rectangle-shaped insulation substrate 1 which forms the side to which light is applied. Preferably the direction in which the wire is expanded becomes parallel to the flow of the light transmitting resin at the time when the light transmitting member 6 is formed, because neither bending nor a cut is generated in the wire 5.

The light transmitting member 6 is formed by the molding formation of, for example, a transparent epoxy resin or the like. Since light is applied from the portion where the light transmitting member 6 is exposed, the exposed portion is formed. According to the present invention, the light reflection member 7 which will be described later is formed in such a manner that the all of one side A in a rectangle shape and at least a part of the sides B and C on both sides adjacent to the above one side is exposed (in an example shown in FIG. 1, virtually a large majority of the sides B and C is formed in an example of a very small size). For example, in the light emitting device having a size of 1.25 mm (vertical side, sides B and C) ×2 mm (side A)×0.8 mm (height), the light emitting device is formed so that the length of the light transmitting member at both sides (sides B and C) is set to about 0.8 mm. This light transmitting member 6 may allow light which is emitted from the LED chip 4 to pass therethrough. For example, a panel can be used which is formed of acrylic resin or the like and has a small projection thereon in accordance with the strength of light and the panel is capable of emitting uniform light. In particular, in the case where the end portion of the exposed portion of the light transmitting member 6 as shown in FIG. 1 has a square shape, the light emission is likely to be discontinued at the square portion, so that a material with a light scattering function has an effect of widening the directivity.

In the light reflection member 7, a white type resin which tends to reflect light is used. When this kind of light emitting device is mounted on the printed board or the like, soldering is performed by means of re-flow in many cases. It is preferable that a certain level of heat resistance is provided therein. Therefore, engineering plastic is preferable, and for example, a liquid crystal polymer is used. In an example shown in FIG. 1 and FIG. 2(a), this light reflection member 7 has a structure in which the upper surface and the rear surface of the light transmitting member 6 are covered. However, the light reflection member 7 may be formed in such a manner that a part of the side surfaces on both sides is covered so that the light transmitting member 6 is exposed over the all of side A and over at least a part of the side B and C on both side adjacent to the side A. In this case, the rear side opposite to side A radiating the light can be formed in a concave shape, but a concave with a small curvature is not preferable because such concave narrows down the directivity.

This light reflection member (case) 7 is formed as a case in advance by resin molding as is shown in a broken view in FIG. 2(a). The case is set on the insulation substrate 1 and is sandwiched with a die of molding formation, and is bonded to the insulation substrate 1 by allowing the above light transmitting resin into the gap thereof. After the case is bonded to the insulation substrate 1 with a bonding agent in advance, and is set in the die, a light transmitting resin can be allowed to flow into the mold. In FIG. 2(a), a view of one light emitting device is shown. In the case where the light emitting device is manufactured in actuality, about 1000 light emitting devices are formed at one time on a large substrate as shown in FIG. 2(b), so that the light reflection member is formed as a case 7a having a length which is equal to the number of rows of cases which are arranged in a horizontal direction.

In order to form this light emitting device, both the surface and the rear surface of a large substrate is patterned for manufacturing about 1000 light emitting devices on a size of about 10 cm×5 cm wherein a conductive film such as copper film or the like is provided, for example, both on the rear surface and the surface thereof, and the surface electrodes 2 and 3 and rear surfaces 2a and 3a are formed by positioning the electrodes to be cut into the light emitting devices. At this time, a hole which serves as the through hole is formed by etching on the rear surface electrodes 2a and 3a at a part where the through hole 1a is formed at a boundary part of the light emitting device. Then, the insulation substrate 1 is etched by the laser processing from the hole, and the through hole la is formed. At this time, the conductive film of the surface electrodes 2 and 3 are not etched. Since the conductive film is not etched with laser processing, the through hole 1a is not penetrated. After that, about 1000 LED chips 4 are die-bonded in a matrix-like configuration, and at the same time, are wire-bonded, so that both electrodes of the LED chip 4 are electrically connected to the pair of surface electrodes 2 and 3. The wire of this wire, bonding is expanded in a direction so that the direction becomes parallel with one side A.

Figure 2B:
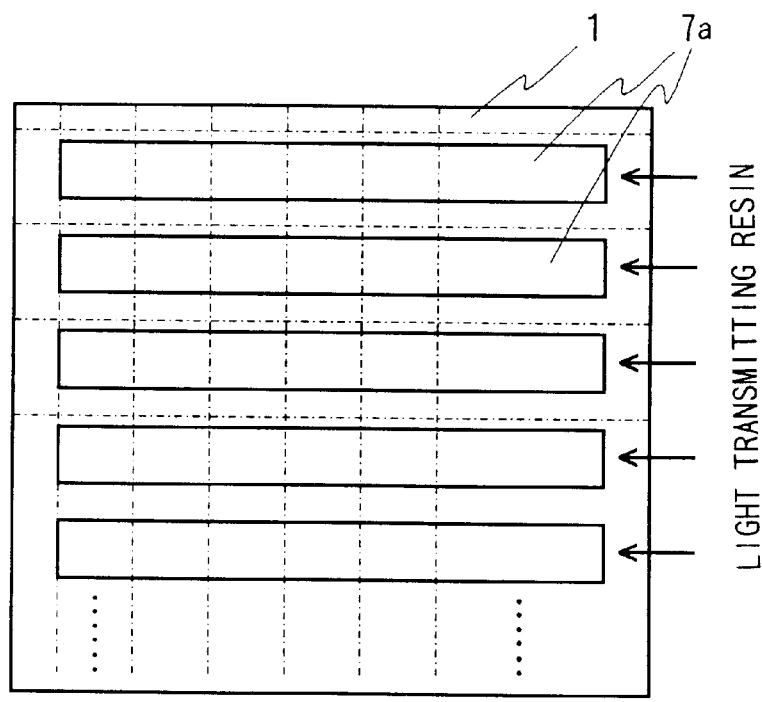

Then, as shown in FIG. 2(b), the case 7a in which light reflection members are integrally formed in the number which can be arranged horizontally is arranged in such a manner that the case covers the LED chip 4 for each of the rows to be set to the molding die. After that, as shown by an arrow in FIG. 2(b), a light transmitting resin is allowed to flow through a gap sandwiched by the upper surface of the case 7a and the insulation substrate 1 with the result that one row portion of the light transmitting member 6 is continuously formed. At this time, the light transmitting resin flows in a direction parallel to the side surface A, so that the wire is expanded in a direction in such a manner that the wire 5 is set to a direction parallel to the direction in which the light transmitting resin flows. As a consequence, the wire 5 does not serve as a resistance against the flow of the resin with the result that the wire is preferably little distorted with the flow of the resin. After that, the substrate is cut at a portion which is designated by one dot line with the result that the substrate is separated into each of the light emitting device.

According to the present invention, since the exposed portion of the light transmitting member is formed also on the side on both sides adjacent to the side as well as on the emitting side of the chip-type light emitting device, light Scan be applied to the horizontal direction with a wide directivity. As a consequence, in the case where the chip-type light emitting device according to the present invention is used as a light source which light is introduced into the light transmitting plate of the backlight, for example, for use in the liquid crystal display device, either the generation of the dark (a portion where light is not allowed to be incident on) is terminated even when the interval of the light emitting device is large or the dark portion becomes very narrow so that a backlight with a uniform luminance within the surface can be obtained.

Furthermore, since the exposed portion of the light transmitting member extends not only over one side but also over the side on both sides adjacent to the former side, the light transmitting member 6 in the portion of one row of light emitting devices which are arranged in many numbers can be collectively formed with the result that the light emitting devices can be formed by molding formation with a simple die structure as described above. As a consequence, the light transmitting member can be formed simply in a very short time.

Figure 3:
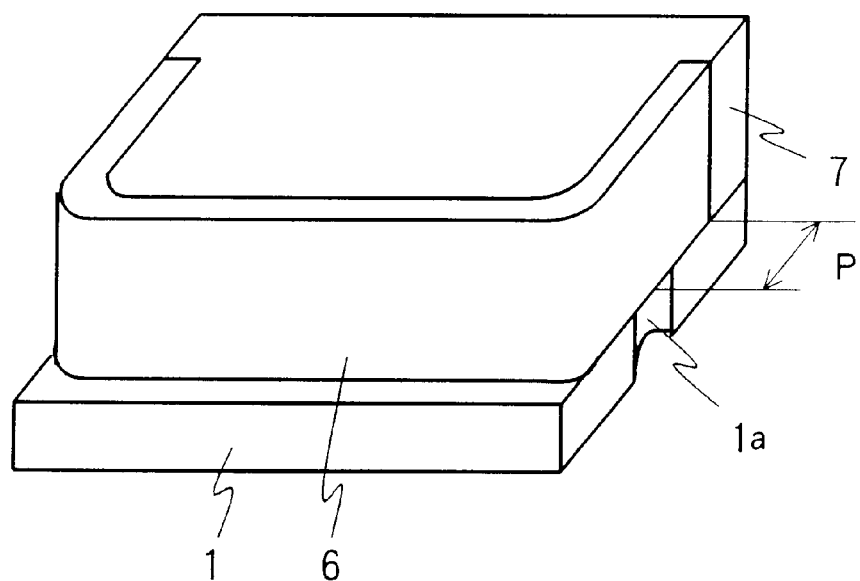
FIG. 3 is a perspective explanatory view showing another embodiment of a chip-type semiconductor light emitting device according to the present invention.
Figure 4:
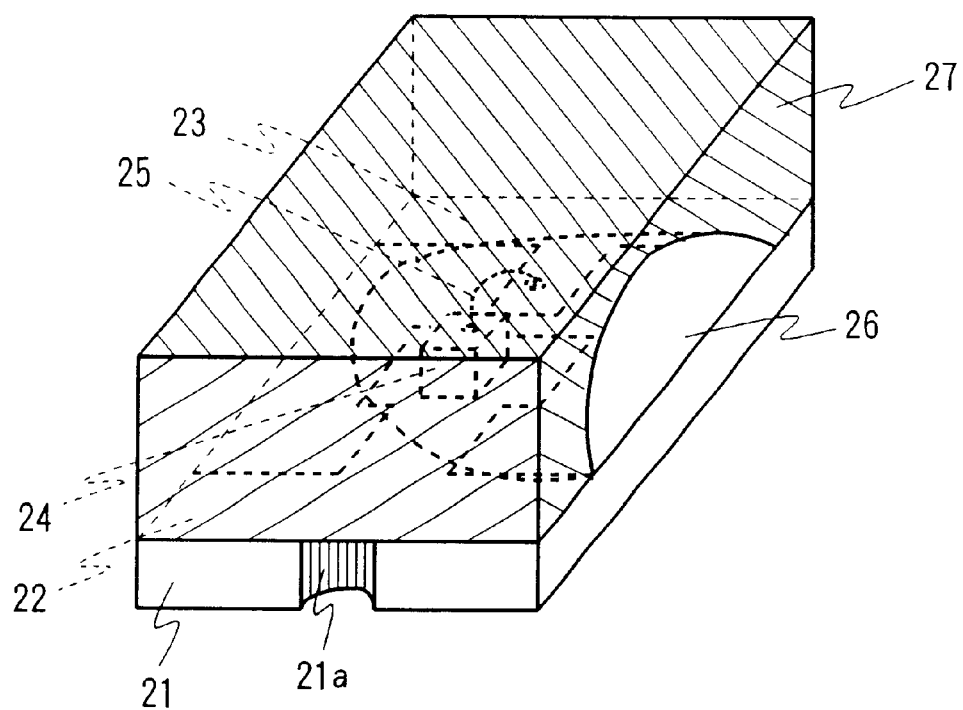
FIG. 4 is a perspective explanatory view showing a conventional side surface emitting chip-type semiconductor light emitting device.
Figure 5:
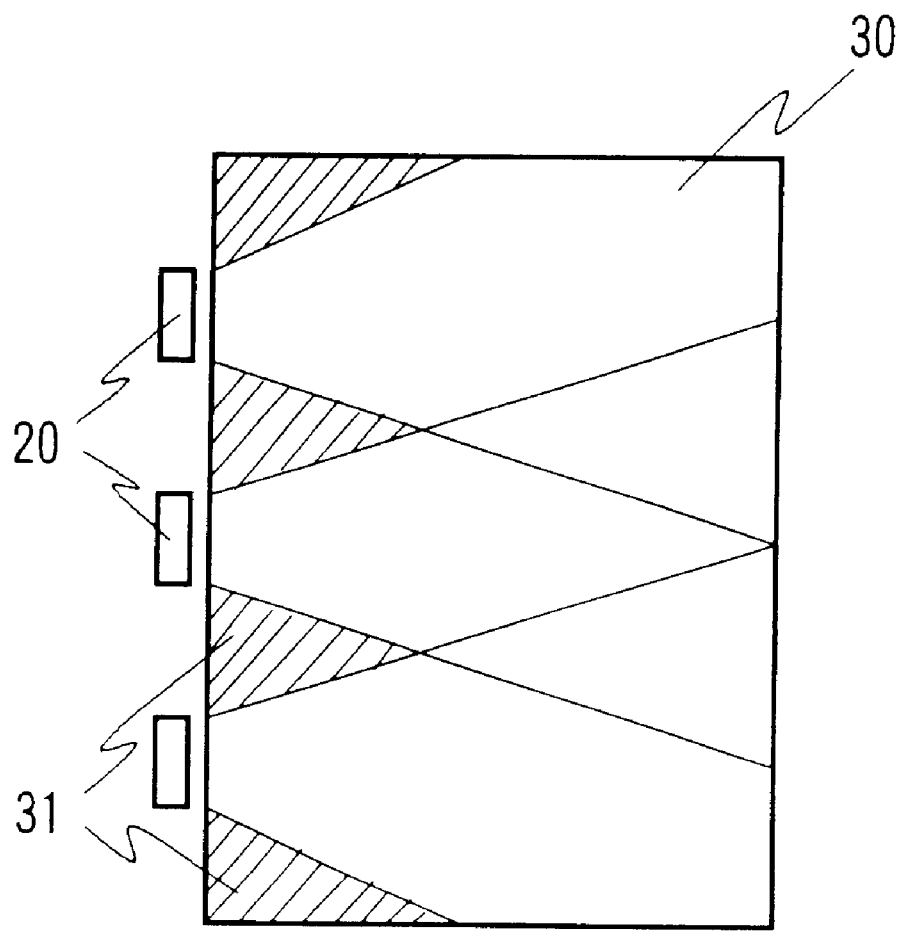
FIG. 5 is an explanatory view in the case where the light emitting device is used as a backlight.

In the example which has been described above, the portion from the side on the light emitting side of the light transmitting member 6 over to the side on both sides has a square shape. With the square shape, the manufacture of the die used for the molding formation can be simple and easy, and cheap. At the same time, preferably, the flow of the light transmitting resin becomes smooth. However, the light radiation characteristic at the square portion becomes discontinuous, and the light radiation in the direction of the square portion does not always become continuous. As a consequence, as has been described above, it becomes desirable to use a material with a light scattering characteristic as a light transmitting member. However, as shown in FIG. 3, light is continuously radiated in a horizontal direction with the usual light transmitting resin as well by forming the square portion into an arc shape in a plane-like shape. It goes without saying that a light transmitting member with this shape and with the light scattering characteristic can be used as well. Incidentally, when this shape is adopted, a molding die into which the light transmitting resin is allowed to flow is formed by the connection of a planar portion P of each of the light emitting devices which are arranged horizontally as an inlet and an outlet of the resin, although a portion where an arc form is formed into a bag-like shape. In the same manner as described above, the resin can be flow at one time from one end portion of the light emitting devices that are arranged in the same manner. Incidentally, like parts in FIG. 3 are denoted by like reference numerals in FIG. 1, and an explanation of such parts are omitted.

According to the present invention, the luminance of the light emitting device is weakened at the central portion in the direction of light radiation, and the light emitting device has a wide directivity so that uniform light can be more easily obtained over a wide scope. As a consequence, when the light emitting device is used as a light source in the case where light is allowed to be incident from one side surface of the light transmitting plate like a backlight of the liquid crystal display device, the generation of the dark decreases where light is not allowed to be incident on the light transmitting plate even with the setting of the interval between the devices to a wide level, and a backlight with uniform luminance can be obtained over the entire surface with a small number of light emitting devices.

Although preferred example have been described in some detail it is to be understood that certain changes can be made by those skilled in the art without departing from the spirit and scope of the invention as defined by the appended claims.

What is claimed is:

1. A chip-type semiconductor light emitting device comprising:
    an insulation substrate having a rectangle shaped plane on which a pair of electrodes are provided;
    a light emitting diode chip provided on said insulation substrate, said chip having an n-side electrode and a p-side electrode connected to said pair of electrodes respectively;

a light transmitting member being provided on said insulation substrate and covering the periphery of said light emitting diode chip; and a light reflection member covering at least part of said light transmitting member, said light refection member being provided so as to radiate light from a portion of said light transmitting member which is not covered and which is exposed, wherein said light reflection member is formed in such a manner that said portion of said light transmitting member is exposed over from one side in said rectangle shape to at least a part of side portions on both sides which continue to said one side, and said light transmitting member is disposed in a space defined by said light reflection member and said insulation substrate.

2. The semiconductor light emitting device of claim 1, wherein at least one of said n-side electrode and p-side electrode of said light emitting diode chip is connected to one of said pair of electrodes provided on said insulation substrate by the wire bonding, and a wire in said wire bonding is bonded in a direction approximately parallel to said one side.

3. The semiconductor light emitting device of claim 1, wherein a boundary between said one side and said side portions has an arc-like shape in a plane shape.

4. The semiconductor light emitting device of claim 1, wherein said light transmitting member is made of a material having a light scattering function.

5. The semiconductor light emitting device of claim 4, wherein a boundary portion between said one side and said side portions has a square shape in a plane shape.

6. The semiconductor light emitting device of claim 1, wherein a pair of rear electrodes are formed on a rear surface of said insulation substrate and are electrically connected respectively to said pair of electrodes provided on a surface of said insulation substrate via a through hole provided on said insulation substrate, and said surface side of said through hole is sealed with said pair of electrodes respectively which are provided on said surface of said insulation substrate.

7. The semiconductor light emitting device of claim 1, wherein said reflection member is formed in such a manner that said member is bent to a back side from an upper surface, and a section form is an L-shape.

8. The semiconductor light emitting device of claim 1, wherein a back side wall of said light reflection member which is a side wall opposite to said one side is formed in a concave shape.

* * * * *